US010863653B2

(12) United States Patent
Kutty et al.

(10) Patent No.: US 10,863,653 B2
(45) Date of Patent: Dec. 8, 2020

(54) THERMAL TESTING SYSTEM AND METHOD OF THERMAL TESTING

(71) Applicant: Dell Products L.P., Round Rock, TX (US)

(72) Inventors: Ajan Daniel Kutty, Austin, TX (US); Marcelo Benetti DeSouza, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 488 days.

(21) Appl. No.: 15/448,960

(22) Filed: Mar. 3, 2017

(65) Prior Publication Data

US 2018/0252593 A1    Sep. 6, 2018

(51) Int. Cl.
*H05K 7/20* (2006.01)
(52) U.S. Cl.
CPC .................. *H05K 7/20836* (2013.01)
(58) Field of Classification Search
CPC .............. G01K 3/10; H05K 7/20836
See application file for complete search history.

(56) References Cited

U.S. PATENT DOCUMENTS

| | | | |
|---|---|---|---|
| 7,363,520 B1* | 4/2008 | Maier, Jr. ................. | G06F 1/26 713/300 |
| 2003/0112025 A1* | 6/2003 | Hamilton ........... | G01R 31/2862 324/750.14 |
| 2009/0256512 A1* | 10/2009 | Begun ....................... | G06F 1/20 318/471 |
| 2011/0161968 A1* | 6/2011 | Bash ...................... | G06F 9/5094 718/102 |
| 2013/0322018 A1* | 12/2013 | Yang ....................... | G06F 1/206 361/695 |

OTHER PUBLICATIONS

"English Machine Translation" of JP-2008293521-A. (Year: 2008).*
Network switch. From Wikipedia, the free encyclopedia. Feb. 21, 2017. 8 pages (Year: 2017).*

* cited by examiner

*Primary Examiner* — Kidest Bahta
(74) *Attorney, Agent, or Firm* — Haynes and Boone, LLP

(57) ABSTRACT

A thermal test system includes first and second heat generating components that include first and second temperature sensors, respectively. A thermal controller is coupled to the first and second temperature sensors and at least one cooling device. The thermal controller receives, from the first temperature sensor during a thermal test, first temperature data that is indicative of heat generated in response to the operation of the first heat generating component, as the first heat generating component and the second heat generating component operate as part of the thermal test. The thermal controller also receives, from each second temperature sensor during the thermal test, second temperature data that is indicative of heat generated in response to the operation of the second heat generating component. The thermal controller then operates the at least one cooling device at a level based on the first temperature data while ignoring the second temperature data.

20 Claims, 5 Drawing Sheets

THERMAL TESTING SYSTEM AND METHOD OF THERMAL TESTING

BACKGROUND

The present disclosure relates generally to information handling systems, and more particularly to thermal testing information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Some IHSs such as, for example, servers, switches, storage systems, and/or other computing devices, include a variety of heat generating components (e.g., processing systems, memory systems, video cards, power systems, etc.) that generate heat. These computing devices often include an internal cooling system that includes temperature sensors coupled to heat generating components, and a thermal controller that activates or deactivates at least one cooling device (e.g., fan(s)) when a temperature sensor provides temperature data that satisfies a temperature condition. Similarly, multiple computing devices such as one or more servers, switches, and/or storage systems may be housed in an enclosure such as a rack or device chassis that includes temperature sensors coupled to the servers, switches, and/or storage systems. A thermal controller may then activate at least one cooling device housed in the rack or device chassis to provide cooling when a temperature sensor provides temperature data that satisfies a temperature condition.

As such, the thermal controller monitors for temperature conditions of heat generating components and, when any of those temperature conditions are satisfied, the thermal controller operates cooling device(s) to provide cooling in a chassis in order to address the temperature condition(s). Such temperature conditions are often predetermined, and may be tested during thermal testing of the device or device system for any device and/or heat generating component that is added to the system. The thermal testing may be used to determine whether a temperature condition provided for a heat generating component results in proper cooling of that heat generating component and/or the system in which it is included. If the heat generating component and/or the system in which it is included do not receive proper cooling based on the temperature condition, the temperature condition may be modified and the thermal testing repeated until proper cooling is obtained.

When thermal testing a heat generating component, it is desirable to perform the thermal testing under the actual conditions that heat generating component will experience in use, with other heat generating components included in the system chassis and operating and generating heat in the system as they would when the system is used by a customer. Operating the system under actual conditions helps to determine the most optimal temperature condition for the heat generating component under the thermal test, and results in the most efficient cooling of the system. However, during such conventional thermal testing using actual conditions, the thermal controller will monitor the temperature conditions for each of the heat generating components in the system (in addition to the temperature condition of the heat generating component being tested) to determine whether their temperatures satisfy their associated temperature conditions, and activate cooling device(s) in the system when those temperature condition(s) are satisfied. In some instances, the temperature conditions of heat generating component(s) that are not being tested may be satisfied before the temperature condition of the heat generating component that is being tested. In such instances, the target temperature of the heat generating component(s) that are not being tested may drive the cooling device(s) in the system, resulting in a failure to actually test the temperature condition of the heat generating component that is being tested. Such failures to accurately test the temperature conditions of heat generating components that are actually being tested may result in subsequent inefficient use of the cooling device(s) in the system that results is the provision of cooling to those heat generating components when it is not needed, as well as possible failures and/or shortened lifespans of those heat generating components due to lack of proper cooling.

Accordingly, it would be desirable to provide an improved thermal testing system.

SUMMARY

According to one embodiment, an Information Handling System (IHS) includes: a communication subsystem; a processing system that is coupled to the communication subsystem; and a memory system that is coupled to the processing system and that includes instruction that, when executed by the processing system, cause the processing system to provide a thermal control engine that is configured to: receive, via the communication subsystem from a first temperature sensor during a thermal test, first temperature data that is indicative of heat generated in response to the operation of a first heat generating component, wherein the first heat generating component and at least one second heat generating component operate as part of a thermal test; receive, via the communication subsystem from at least one second temperature sensor during the thermal test, second temperature data that is indicative of heat generated in response to the operation of the at least one second heat generating component; and operate at least one cooling device at a first level based on the first temperature data while ignoring the second temperature data.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
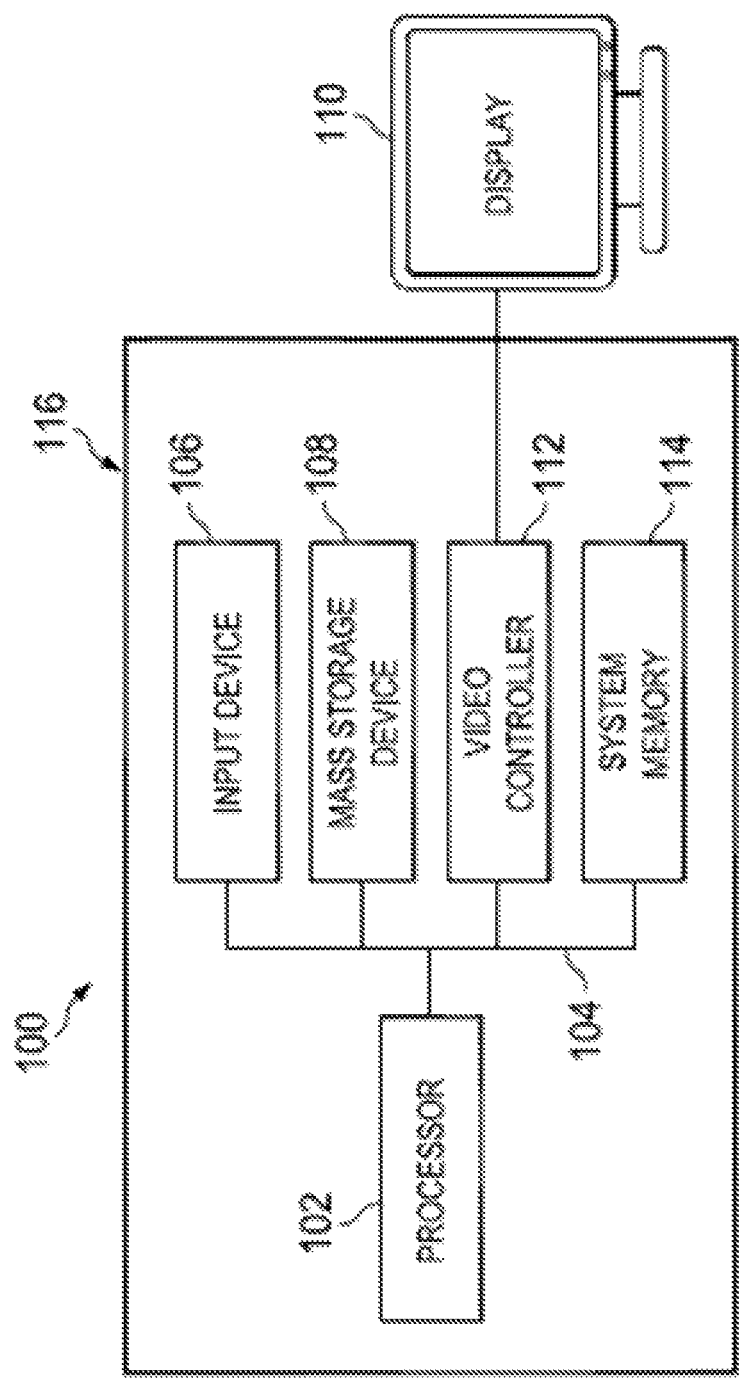
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video thermal controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
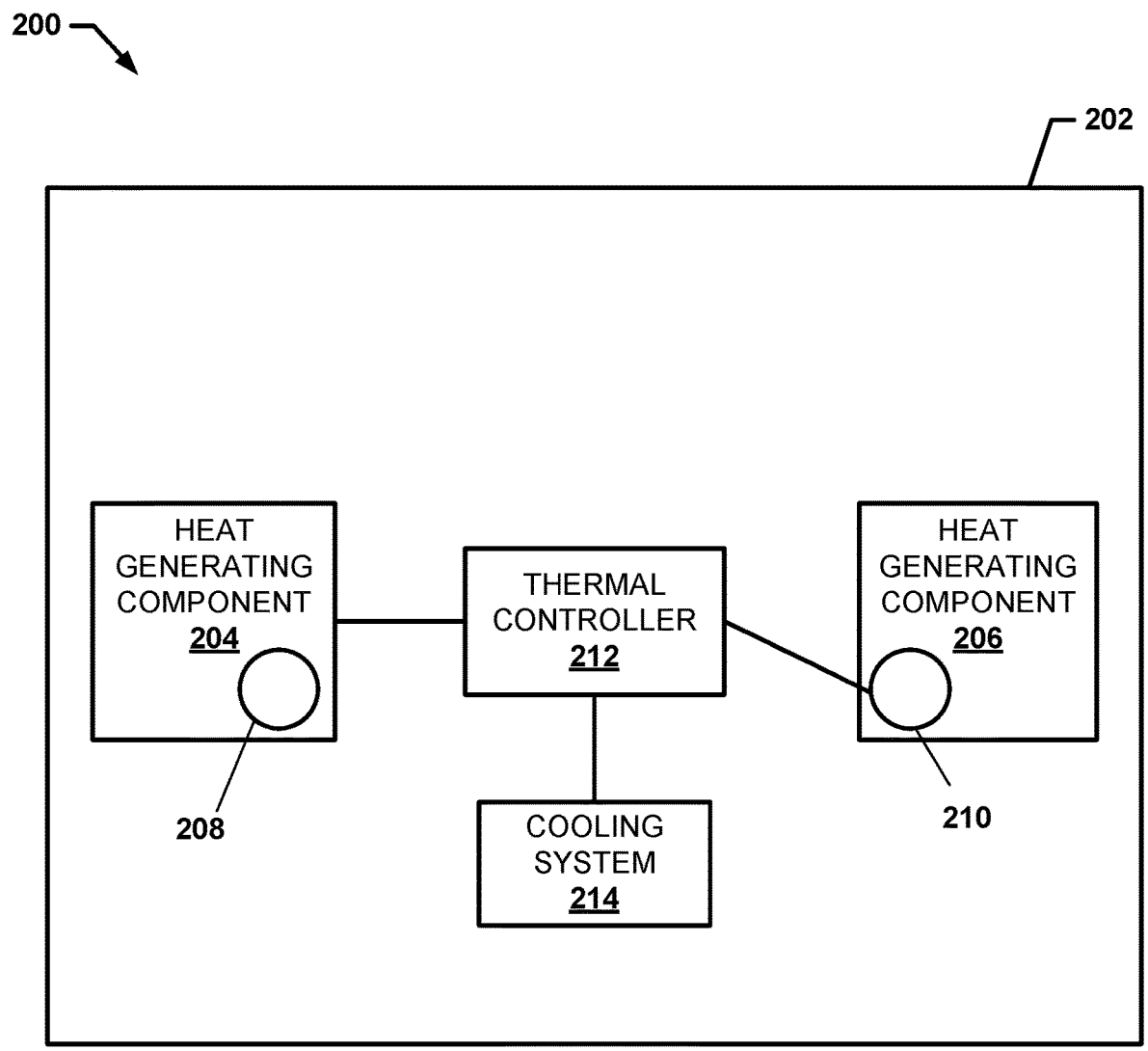
FIG. 2 is a schematic view illustrating an embodiment of a thermal testing system.

Referring now to FIG. 2, a schematic view illustrating an embodiment of a thermal testing system 200 is illustrated. In an embodiment, the thermal testing system 200 may be a part of the IHS 100 discussed above with reference to FIG. 1, and/or may include some or all of the components of the IHS 100. In the illustrated embodiment, the thermal testing system 200 includes a chassis 202 that houses the components of the thermal testing system 200, only some of which are illustrated in FIG. 2. For example, the chassis 202 may define a chassis housing, and each of a heat generating component 204 and a heat generating component 206 may be located in the chassis housing. In an embodiment, the heat generating component 204 and/or the heat generating component 206 may be a part of the IHS 100 discussed above with reference to FIG. 1, and/or may provide one or more of the components of the IHS 100.

In an embodiment, the thermal testing system 200 includes a temperature sensor 208 that is located in the chassis 202, coupled to the heat generating component 204, and configured to indicate a temperature of the heat generating component 204. Likewise, a temperature sensor 210 is located in the chassis 202, coupled to the heat generating component 206, and configured to indicate a temperature of the heat generating component 206. While one temperature sensor is illustrated as being coupled to each heat generating components 204 and 206, respectively, any number of temperature sensors may be coupled to each heat generating component 204 and/or 206 to, for example, monitor the temperature of different hot spots on the heat generating components 204 and/or 206. In various examples, the temperature sensor 208 or 210 may be embedded in the heat generating components 204 and/or 206 (e.g., a temperature sensor may be inside a CPU or a dedicated network processor). The temperature sensors 208 and 210 may include a mechanical thermometer, a bimetallic strip, a thermistor, a thermocouple, a resistance thermometer, a silicon bandgap sensor, and/or other temperature sensors that would be apparent to one of skill in the art in possession of the present disclosure.

In an embodiment, the thermal testing system 200 includes a thermal controller 212 that may be housed in and/or outside the chassis 202, and that may be coupled directly or indirectly to each of the temperature sensor 208 and the temperature sensor 210. For example, the thermal controller 212 may be coupled to the temperature sensor 208 indirectly through the heat generating component 204 such that the temperature sensor 208 communicates temperature data to the heat generating component 204, and the heat generating component 204 then communicates that temperature data to the thermal controller 212. In another example, the thermal controller 212 may be directly coupled to the temperature sensor 210 to receive temperature data directly from the temperature sensor 210.

In an embodiment, the thermal testing system 200 also includes a cooling system 214 that is coupled to the thermal controller 212. For example, the cooling system 214 may include one or more active cooling devices (e.g., fan(s), liquid cooling system(s), and/or other active cooling device known in the art) that are configured to operate at different levels to provide different cooling effects (e.g., a first fan speed, a second fan speed that is faster than the first fan speed, etc.). However, a variety of other cooling devices known in the art may be included in the cooling system 214 (e.g., passive cooling device in addition to the active cooling devices) while remaining within the scope of the present disclosure. The thermal controller 212 may be configured to operate the cooling system 214 (e.g., by enabling or disabling power from a power source to the cooling system 214, providing operating instructions to the cooling system, etc.) based on the temperature of the heat generating component 204 that is indicated by the temperature sensor 208, and/or the temperature of the heat generating component 206 the indicated by the temperature sensor 210, in order to cool the heat generating component 204 and/or the heat generating component 206.

In an embodiment, the thermal testing system 200 may be provided in variety of information handling systems such as, for example, desktop computing systems, laptop/notebook computing systems, tablet computing systems, mobile phones, Internet Of Things (IOT) devices, sensors devices, server computing systems, networking devices (e.g., switches), and/or other computing systems known in the art. Alternatively or additionally, the thermal testing system 200 may be provided in a rack or device chassis (e.g., in a datacenter) that houses a plurality of server devices, networking devices (e.g., switches), and/or storage systems in a vertical (e.g., one-on-top-of-the-other) orientation. However, one of skill in the art in possession of the present disclosure will recognize that the teachings of the present disclosure may be applied to different types of racks and/or device chassis used in different situations (e.g., other than datacenters) and that house other types of devices or combinations of devices in any of a variety of orientations (e.g., horizontal/side-by-side orientations). In the specific embodiments below, the heat generating components 204-206 may be provided by processing systems, memory systems, communication systems, video systems, storage systems, and/or other heat generating components utilized by servers, networking devices, and/or a variety of other computing devices known in the art.

Figure 3:
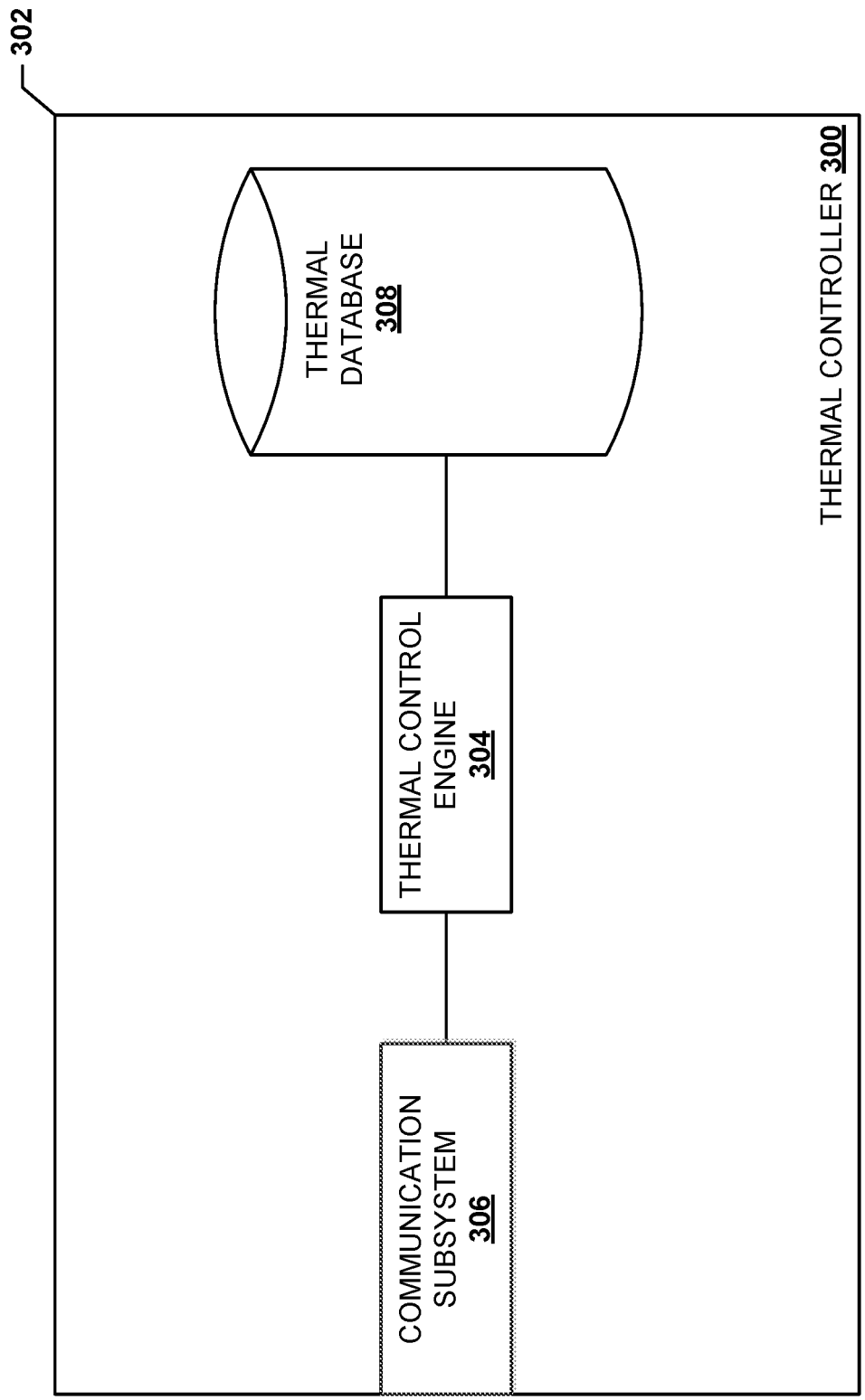
FIG. 3 is a schematic view illustrating an embodiment of a thermal controller used in the thermal testing system of FIG. 2.

Referring now to FIG. 3, an embodiment of a thermal controller 300 is illustrated that may be the thermal controller 212 discussed above with reference to FIG. 2. In some embodiments, the thermal controller 300 may be the IHS 100 discussed above with reference to FIG. 1, and/or may include some or all of the components of the IHS. While the thermal controller 300 is illustrated and described as a single controller (e.g., a controller provided for a server device, a desktop computer, a laptop/notebook computer, a tablet computer, a phone, and/or in a variety of other devices known in the art), the thermal controller 300 may be provided for more than one device (e.g., a plurality of server devices or other computing devices) while remaining within the scope of the present disclosure. In the illustrated embodiment, the thermal controller 300 includes a chassis 302 that houses the components of the thermal controller 300, only some of which are illustrated in FIG. 3. For example, the chassis 302 may house a processing system (not illustrated, but which may include the processor 102 discussed above with reference to FIG. 1) and a memory system (not illustrated, but which may include the system memory 114 discussed above with reference to FIG. 1) that includes instructions that, when executed by the processing system, cause the processing system to provide a thermal control engine 304 that is configured to perform the functions of the thermal control engines and the thermal controllers discussed below.

The chassis 302 may also house a storage system (not illustrated, but which may include the storage device 108 discussed above with reference to FIG. 1) that is coupled to the thermal control engine 304 (e.g., via a coupling between the storage system and the processing system) and that includes a thermal database 308 that is configured to store the thermal control rules, temperature conditions (e.g., critical temperature conditions and target temperature conditions) and/or other information (e.g., heat generating component identifiers, cooling device identifiers, associations between the temperature conditions and the identifiers, and other thermal data) utilized to provide the functionality discussed below. The chassis 302 may also house a communication subsystem 306 that is coupled to the thermal control engine 304 (e.g., via a coupling between the communication subsystem 306 and the processing system) and that may include a Network Interface Controller (NIC), a wireless communication subsystem (e.g., a WiFi subsystem, a Bluetooth subsystem, etc.), as well as ports or other connectors that are configured to connect to the heat generating components, temperature sensors, and/or system components discussed below. While a specific thermal controller 300 has been illustrated and described, one of skill in the art in possession of the present disclosure will recognize that thermal controllers may include a variety of components other than those described above and that provide for the performance of conventional controller functionality, as well as the functionality discussed below, while remaining within the scope of the present disclosure.

Figure 4:
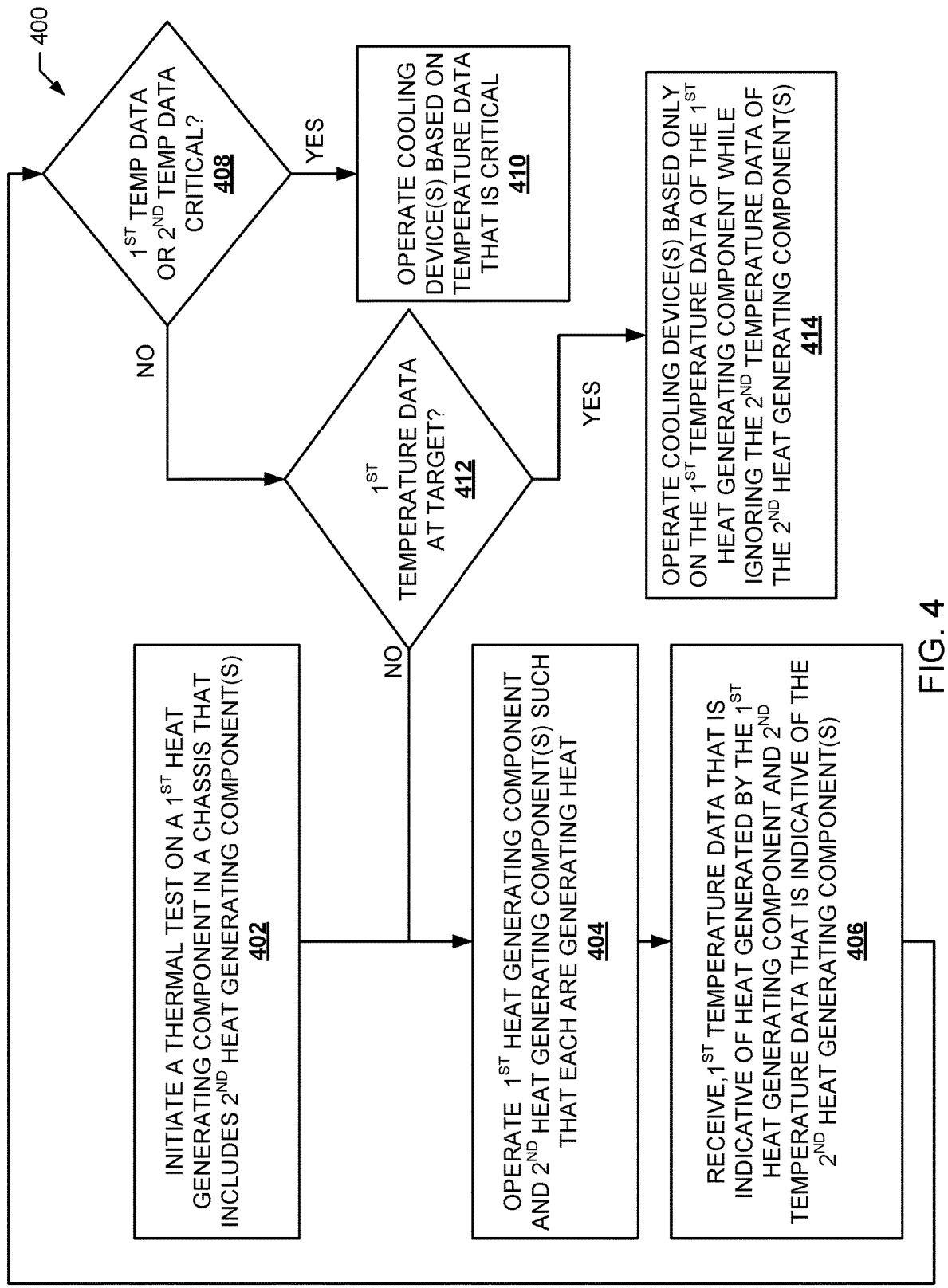
FIG. 4 is a flow chart illustrating an embodiment of a method for performing thermal testing.

Referring now to FIG. 4, an embodiment of a method 400 for performing thermal testing is illustrated. As discussed below, the systems and methods of the present disclosure provide a thermal controller that is configured to receive temperature data from temperature sensors that generate temperature data based on the operation of heat generating components in a chassis during a thermal test, but only operate cooling device(s) based on the temperature data of a heat generating component that is being tested, while ignoring temperature data and/or masking temperature conditions that would otherwise result in the operation of the cooling device(s) when that temperature data is based on the operation of heat generating components that are not being tested. As such, more accurate temperature conditions for heat generating components may be determined because a heat generating component in a chassis that is being tested is allowed to operate under realistic conditions that include the operation of multiple other heat generating components in the chassis such that all of the heat generating components in the chassis generate heat at the same time, as they will during their normal operation.) Ignoring temperature data and/or masking temperature conditions of the heat generating components that are not being tested ensures that those heat generating components are not driving the cooling device(s) in the system when their associated temperature conditions are satisfied before the temperature condition of the heat generating component that is being tested, thus allowing for the determination of temperature condition(s) (for a heat generating component being tested) that provides for more efficient and adequate cooling that is possible using conventional thermal testing techniques.

The method 400 begins at block 402 where a thermal test is initiated on a first heat generating component in a chassis that includes at least one second heat generating component. In an embodiment, at block 402 the thermal controller 212 may initiate the thermal testing of the thermal testing system 200. With reference to FIG. 2, prior to the initiation of the thermal testing at block 402, the heat generating component 204 may be added to the chassis 202 of the thermal testing system 200 with the heat generating component 206 (which may have already been present in the chassis 202.) In an embodiment, one or more default temperature conditions may be associated with the heat generating component 204 and may be programmed into the thermal controller 212/300 such that they are stored in the thermal database 308 illustrated in FIG. 3. For example, the default temperature conditions may include temperature conditions such as a target temperature condition that, when satisfied, causes the thermal controller 212 to activate the cooling system 214. In a specific embodiment, the target temperature condition may be a temperature condition that is below a maximum allowable temperature for the heat generating component 204, and that allows the cooling system 214 to cool the heat generating component 204 before the heat generating component 204 reaches that maximum allowable temperature that may result in damage to the heat generating component 204. Additionally, the temperature conditions may include a standby temperature condition that, when satisfied, causes the thermal controller 212 to deactivate the cooling system 214 to save on energy and reduce noise levels when cooling is not needed for the heat generating component 204. Furthermore, the temperature conditions may include a critical temperature condition that is less the maximum allowable temperature but greater than the target temperature condition, and that indicates that the heat generating component 204 needs to shut down and/or the cooling system 214 needs to be operated immediately at a level that will prevent damage to the heat generating component 204. While specific examples of the temperature conditions are described above, one skilled in the art in possession of the present disclosure will recognize that other thermal conditions will fall within the scope of the present disclosure as well.

Once the heat generating component 204 is added to the thermal testing system 200 and the default temperature conditions have been provided to the thermal controller 212, an administrator may initiate a thermal test of the thermal testing system 200 to test one or more of the default temperature conditions, as well as to determine whether the thermal controller 212 operates the cooling system 214 (i.e., as a result of a temperature condition being satisfied) to satisfy cooling requirements for the heat generating component 204 and/or the thermal testing system 200. As described herein, the thermal testing is performed to test the target temperature condition for the heat generating component. However, thermal testing may be performed to test other thermal conditions that would be apparent to one of skill in the art in possession of the present disclosure and thus would fall within its scope. The target temperature condition of the heat generating component 204 may be tested to, for example, determine whether the thermal testing system 200 properly cools the heat generating component 204 to satisfy a cooling requirement at that target temperature condition for the heat generating component 204 and/or the thermal testing system 200. For example, in some situations a default target temperature condition may cause the thermal controller 212 to activate the cooling system 214 too soon, resulting in an inefficient cooling system 214 that operates when it does not need to, which may result in wasted power and increased noise levels (e.g., fan noise). In another example, in some situations the default target temperature condition may cause the thermal controller 212 to activate the cooling system 214 too late, allowing the actual temperature of the heat generating component 204 to reach levels that can damage the heat generating component 204 and/or otherwise reduce the lifespan of the heat generating component 204.

In an embodiment, the thermal testing may be provided by a set of machine-readable instructions stored in a non-transitory memory of the thermal testing system 200, the thermal controller 212, the heat generating component 204, and/or the heat generating component 206. Those machine-readable instruction, when executed by a processor of the thermal testing system 200, the thermal controller 212, the heat generating component 204, and/or the heat generating component 206, may provide a thermal testing engine that is configured to provide instructions to the heat generating component 204 and/or the heat generating component 206 to perform operations such that the heat generating component 204 and the heat generating component 206 operate to generate heat. In an embodiment, a user device may be coupled (though a network or through a local connector) to the thermal testing system 200, and that user device may provide the thermal testing engine that controls the thermal testing. The initiation of the thermal testing may also provide an indication to the thermal controller 212 to switch from a standard mode of operation to a test mode of operation that provides for the activation and deactivation of different features of the thermal controller 212, as discussed below. As such, the thermal testing system 200 may be a computing system that may be tested in a test mode, and then provided to a customer to operate in a standard mode.

Figure 5:
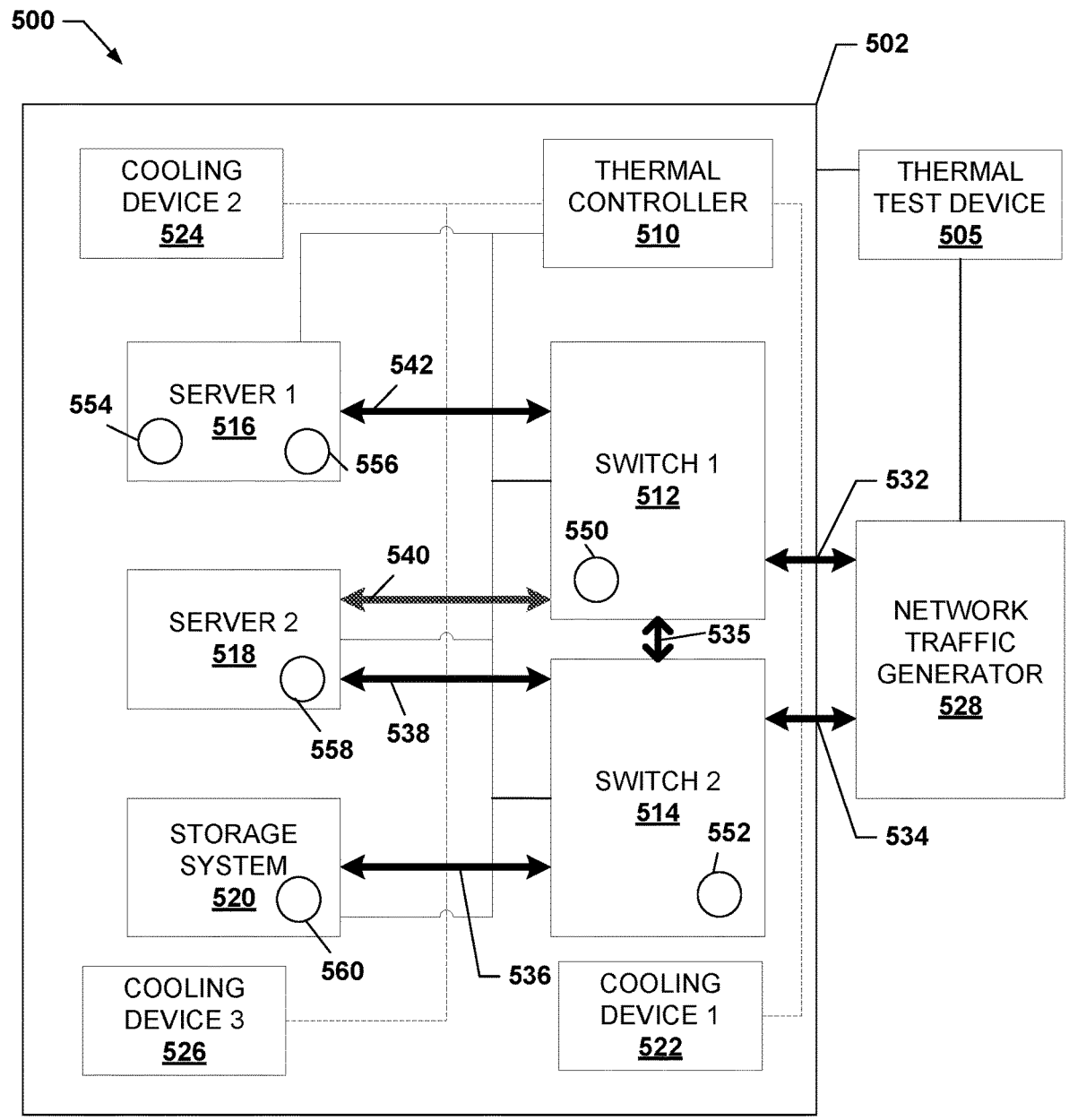
FIG. 5 is a schematic view illustrating an embodiment of a thermal testing system.

Referring now to FIG. 5, a schematic view illustrating an embodiment of a thermal testing system 500 is illustrated. The thermal testing system 500 provides a specific example of the thermal testing system 200 of FIG. 2, and is used to describe operations in the method 400 of FIG. 4. In an embodiment, the thermal testing system 500 may be provided by the IHS 100 discussed above with reference to FIG. 1, and/or may include some or all of the components of the IHS 100. The chassis 502, which may be the chassis 202, defines a chassis housing that includes a switch 512, a switch 514, a server 516, a server 518, and a storage system 520, any of which may be the heat generating component 204 and/or heat generating component 206. In this specific example, the switch 512 has been added to the thermal testing system 500 such that the switch 512 is the heat generating component that is being testing using the thermal test. A thermal controller 510, which may be the thermal controller 212 of FIG. 2 and/or the thermal controller 300 of FIG. 3, includes a default target temperature condition for the switch 512, while the thermal controller 510 may also store temperature conditions that have been previously tested, and/or other temperature conditions for the switch 514, the server 516, the server 518, and the storage system 520.

In an embodiment, one or more of the heat generating components 512-520 may be coupled to a network traffic generator 528 (e.g., another thermal testing system, a computing device that generates network traffic, and/or other network traffic generators known in the art). The network traffic generator 528 may be external from the chassis 502 and coupled to the one or more of the heat generating components 512-520 by one or more external network cables (e.g., Ethernet cables, fiber optic cables, and/or other cables known in the art). For example, the switch 512 may be coupled to the network traffic generator 528 with an external cable 532 and the switch 514 may be coupled to the network traffic generator 528 with an external cable 534 such that network traffic can be provided between the network traffic generator 528 and the switches 512 and 514. Furthermore, two or more of the heat generating components may be coupled to each other by one or more internal network couplings that communicate the network traffic provided by the network traffic generator 528 and/or other internal communications. For example, an internal coupling 535, an internal coupling 536, an internal coupling 538, an internal coupling 540, and an internal coupling 542 may be provided in the thermal testing system 500 allow network traffic to be communicated between the switches 512-514, the servers 516-518, and the storage system 520. While a specific example of the internal couplings 535-542 is illustrated in FIG. 5, it will be apparent to one of skill in the art that additional internal couplings (e.g., an internal coupling between the storage system 520 and the switch 512, an internal coupling between the server 516 and the switch 514, and redundant internal couplings) will fall under the scope of the present disclosure. As would be understood by one of skill in the art in possession of the present disclosure, when network traffic is provided through the external network cables and/or internal network couplings, the external network cables, internal network couplings, and/or ports to which they connect may generate thermal energy. Furthermore, other external computing devices (e.g., a thermal test device 505 discussed below) may be coupled to the switches 512 and 514 such that the external computing devices have logical connectivity to the servers 516-518 and/or the storage system 520 and are configured to cause processor activity on the servers 516-518 and/or read/write operations in the storage system 520; thus, causing the servers 516-518 and/or the storage system 520 to generate heat.

In various examples, each of the switch 512, the switch 514, the server 516, the server 518, and the storage system 520 may include one or more temperature sensors which may be the temperature sensors 208 and/or 210 of FIG. 2. In the illustrated example, the switch 512 is coupled to a temperature sensor 550, the switch 514 is coupled to a temperature sensor 552, the server 516 is coupled to a temperature sensor 554 and a temperature sensor 556, the server 518 is coupled to a temperature sensor 558, and the storage system 520 is coupled to a temperature sensor 560. The thermal controller 510 may be coupled each temperature sensor 550-560 directly and/or, as illustrated, indirectly through their respective heat generating components 512-520. Furthermore, the thermal controller 510 is coupled to a cooling device 522, a cooling device 524, and a cooling device 526 that may provide the cooling system 214 of FIG. 2. The cooling devices 522-526 may be active cooling devices (e.g., fan(s), liquid cooling system(s), and/or other active cooling devices known in the art) that may be operated by the thermal controller 510 independently from each other at different levels of cooling effect. However, a variety of other cooling devices and/or cooling systems that would be apparent to one of skill in the art in possession of the present disclosure may be provided in the thermal testing system 500 while remaining within the scope of the present disclosure. In the specific example of FIG. 5, the cooling devices 522-526 may be fans whose fan speeds are controlled by the thermal controller 510 based on temperature data received from the temperature sensor(s), and the chassis 502 may include at least one airflow inlet and an airflow outlet for the cooling device 522-526 to draw cool air into the chassis 502 while expelling heated air out of the chassis 502.

In an embodiment, a thermal test device 505 may be coupled to the thermal testing system 500 and/or the network traffic generator 528. The thermal test device 505 may include a thermal test engine that provides instructions to the thermal testing system 500 and/or network traffic generator 528 to cause a thermal test to be performed. The thermal test device 505 may then receive thermal test data from the components housed in the chassis 502 and/or the network traffic generator 528, and determine whether a cooling requirement of the thermal testing system 500 is being satisfied by the temperature conditions stored on the thermal controller 510. In various examples, the thermal test device 505 may be coupled to the switches 512 and/or 514 such that the thermal test device 505 has logical connectivity to the servers 516-518 and/or the storage system 520 and is configured to cause processor activity on the servers 516-518 and/or read/write operations in the storage system 520; thus, causing the servers 516-518 and/or the storage system 520 to generate heat. Furthermore, the thermal test device 505 may retrieve thermal test data from the thermal controller 510 such that the thermal test data may be provided to an administrator and/or a thermal testing algorithm.

At block 402 of method 400, the switch 512 may have been connected to the thermal testing system 500, and the thermal controller 510 may have been provided default temperature conditions for the switch 512 such as, for example, a target temperature condition that is to be tested. The thermal test device 505 may then initiate a thermal testing algorithm to perform the thermal test (and that may cause the thermal controller 510 to change its operating mode from a standard mode of operation to a thermal testing mode.) For example, during the standard mode of operation, the thermal controller 510 may receive temperature data from all of the temperature sensors 550-560, and use all of that temperature data to determine whether to activate or deactivate one or more of the cooling devices 522-526 to cool one or more of the heat generating components 512-520 based on temperature conditions stored for each heat generating component 512-520.

Returning to FIG. 4, the method 400 then proceeds to block 404 where a first heat generating component and at least one second heat generating component operate as part of the thermal test. In an embodiment, at block 404 the heat generating component 204 and the heat generating component 206 may be operating as part of the thermal test such that both heat generating components 204 and 206 generate heat. The thermal test that is initiated at block 402 may include instructions that causes the heat generating component 204 and the heat generating component 206 to perform operations that cause those heat generating component 204 to generate heat. For example, the heat generating component 204 and/or 206 may be a processor (or include a processor) that generates heat when computer readable instructions are processed by the processor. In another example, the heat generating component 204 and/or 206 may be a network interface card (NIC) (or include a NIC) that generates heat when receiving and sending network data traffic.

Continuing with the specific example of FIG. 5, and with reference to block 404 of method 400, the switch 512, the switch 514, the servers 516-518, and the storage system 520 may be operating during the thermal test such that the switch 512, the switch 514, the servers 516-518, and the storage system 520 are generating heat. For example, the switch 512, the switch 514, the servers 516-518, and the storage system 520 may be operating to communicate network data traffic received from the network traffic generator 528 through the external cables 532-534 during the thermal test. Furthermore, the switch 512 may provide commands to be executed by the servers 516-518 from the thermal test device 505 through the internal couplings 542 and 540 respectively, or other internal couplings not illustrated, while the switch 514 may provide commands to be executed by the server 518 and/or read/write commands to the storage system 520 from the thermal test device 505 on the internal couplings 538 and 536, respectively, or other internal couplings not illustrated. Each of the external cables 532-534 and the internal couplings 535-542 may generate heat in communicating the network data traffic, commands, and/or read/write operations that is in addition to the heat generated by the heat generating components 512-520 when processing the network data traffic, commands, and/or read/write operations.

The method 400 then proceeds to block 406 where first temperature data is received that is indicative of heat generated in response to the operation of the first heat generating component, and second temperature data is received that is indicative of heat generated in response to the operation of the second heat generating component(s). In an embodiment, at block 406 the temperature sensor 208 and the temperature sensor 210 may capture temperature measurements and generate temperature data in the form of an electrical signal that is provided to the thermal controller 212, and the thermal controller 212 may then use that temperature data to determine the actual temperatures being detected by the temperature sensor 208 and the temperature sensor 210. For example, the temperature data may be received by the thermal control engine 304 of the thermal controller 212/300 through the communication subsystem 306. In an embodiment, the temperature sensor 208 and the temperature sensor 210 may be positioned on the heat generating components 204 and 206, respectively, such that the temperature sensors 208 and 210 are measuring the temperature of the heat generating components 204 and 206 at hot spots on the heat generating components 204 and 206 (e.g., the hottest surfaces produced by the heat generating components 204 and 206.) Additional temperature sensors may be positioned at other locations on each of the heat generating components 204 and 206 to measure temperature of those locations, which may provide two or more different temperatures for the same heat generating component at the same time.

As illustrated in FIG. 5, the switch 512 that is under test includes a temperature sensor 550 that is providing temperature data to the thermal controller 510, while the server 516 includes the temperature sensor 554 and the temperature sensor 556, which may provide two different temperatures that the server 516 is generating at a given time. However, some heat generating components, such as the internal couplings 535-542 and the external cables 532-534, may not be coupled to a temperature sensor. However, heat generated by the internal couplings 535-542 and the external cables 532-534, as well as other heat generating components in the chassis 502 that are not coupled to a temperature sensor, may contribute to the temperature that is being measured at the temperature sensor 550 of the switch 512. Similarly, the operation of any of the other heat generating component 514-520 may produce heat that contributes to the temperature that is being measured by the temperature sensor 550 of the switch 512.

Returning to FIG. 4, the method 400 then proceeds to decision block 408 where it is determined whether the first temperature data or the second temperature data satisfies a critical temperature condition during the thermal test. In an embodiment, at block 408 the thermal controller 212 may take into consideration temperature data from any of the temperature sensors 208 and 210 that is indicative of the temperature of the heat generating components 204 and 206 when determining whether a critical temperature condition is satisfied. The thermal controller 212 may monitor for the critical temperatures during the thermal test to prevent the heat generating components 204 and/or 206 from reaching their maximum temperature in order to ensure that the heat generating components 204 and/or 206 are not damaged during the thermal test. Monitoring the temperature data from all heat generating components 204 and/or 206 at decision block 408 may be performed because, as discussed below, the thermal controller 212 may mask the target temperature conditions for the heat generating component 206 if the heat generating component 206 is not subject to the thermal test, and will thus prevent cooling of the heat generating component 206 when it would otherwise be cooled based on its temperature reaching its associated target temperature condition(s). However, in other embodiments, the thermal controller 212 may completely ignore the temperature data received from temperatures sensor 210 if the heat generating component 206 associated with the temperature sensor 210 is not a subject of the thermal test.

In determining whether temperature data from a particular temperature sensor 208 and/or 210 has satisfied a critical temperature condition at decision block 408, the thermal control engine 304 of the thermal controller 300 may compare the received temperature data from the temperature sensor 208 and/or 210 to a critical temperature condition that is stored in the thermal database 308 and that is associated with the temperature sensor 208 and/or 210 from which the temperature data was received, and/or associated with the heat generating component 204 and/or 206 that is coupled to that temperature sensor 208 and/or 210, respectively. For example, the temperature data received from the temperature sensor 210 may include a thermal identifier for the temperature sensor 210 and/or the heat generating component 206, and the thermal control engine 304 may "look-up" that received thermal identifier in a thermal table stored in the thermal database 308. The thermal identifier in the thermal table may be associated with a critical temperature condition, a target temperature condition, a standby temperature condition, and/or any other thermal condition that would be apparent to one of skill in the art in possession of the present disclosure. At decision block 508, the thermal control engine 304 may compare the temperature data received from the temperature sensor 210 and the critical temperature condition associated with that temperature sensor 210 to determine whether that critical temperature condition is satisfied. For example, when determining whether the critical temperature condition is satisfied, the thermal control engine 304 may determine whether the temperature data indicates that the heat generating component 206 is operating at a temperature that is at or above a critical temperature.

If the critical temperature condition is satisfied, the method 400 may proceed to block 410 where cooling device(s) are operated based on the temperature data that satisfies the critical temperature condition. In addition, the cooling device(s) may be operated based on the heat generating component that is associated with the critical temperature condition. In an embodiment, at block 410, upon the critical temperature condition being satisfied, the thermal controller 212 may operate the cooling system 214 at a level that cools the heat generating component 204 and/or 206 that is associated with the critical temperature. For example, upon a critical temperature condition being satisfied, the thermal controller 212 may return to a standard mode of operation (from a test mode of operation) that causes the thermal controller 212 to operate the cooling system 214 to cool any heat generating component 204 and/or 206 according to any of their respective temperature conditions. Therefore, temperature data from the heating generating component 204 and/or 206 that is associated with the critical temperature condition, regardless of whether that heat generating component 204 and/or 206 is under the thermal test, may be used to drive the cooling system 214. In another example, upon receiving temperature data satisfying a critical temperature condition, the thermal controller 212 may cause the thermal testing system 200 to shut down in order to avoid damaging any of the heat generating components 204 and/or 206 that are experiencing the critical temperature condition.

Referring to the example thermal testing system 500 of FIG. 5, at blocks 408 and 410 of the method 400, the thermal controller 510 may determine whether any of the critical temperature conditions associated with the switches 512-514, the servers 516-518, and/or the storage system 520 have been satisfied based on the temperature data received from their respective temperature sensors 550-560. For example, the temperature data received from a temperature sensor 556 of the server 516 may satisfy a critical temperature condition associated with the server 516. In this example, the server 516 is not under test (e.g., a target temperature condition of the server 516 has been tested and verified, or not currently being tested) while a target temperature condition of the switch 512 is being tested. Because the thermal controller 510 has determined that the critical temperature condition associated with the server 516 has been satisfied, the thermal controller 510 may operate the cooling devices 522, 524, and/or 526 at a level that is associated with the critical temperature condition of the server 516 to ensure that the server 516 is provided cooling such that its cooling requirements are satisfied.

Returning to decision block 408 of method 400, if neither of the first temperature data or the second temperature data satisfies the critical temperature condition, the method 400 may proceed to block 412 where it is determined whether a target temperature condition of the first heat generating component that is being tested is satisfied. In an embodiment, at block 412 the thermal controller 212 may determine that the temperature data received from temperature sensor 208 indicates that the heat generating component 204, which may be the heat generating component undergoing the thermal test, satisfies its associated target temperature condition. For example, if the heat generating component 204 is undergoing the thermal test, while the heat generating component 206 is not undergoing the thermal test, the thermal controller 212 may use the temperature data received from the temperature sensor 208 to determine whether a target temperature condition of the heat generating component 204 is satisfied. Furthermore, even if the temperature data received from the temperature sensor 210 that is coupled to the heat generating component 206 would satisfy a target temperature condition for the heat generating component 206 under a standard mode of operation the thermal controller 212, that temperature data will not cause any cooling to be provided for the heat generating component 206 at decision blocks 412 and 414, as discussed below.

When determining whether temperature data from the temperature sensor 208 has satisfied a target temperature condition, the thermal control engine 304 of the thermal controller 300 may compare the received temperature data from the temperature sensor 208 to a target temperature condition that is stored in the thermal database 308 and that is associated with the temperature sensor 208 from which the temperature data is received, and/or the heat generating component 204 that is coupled to that temperature sensor 208. For example, the temperature data received from the temperature sensor 208 may include a thermal identifier of the temperature sensor 208 and/or the heat generating component 204, and the thermal control engine 304 may "look-up" that received thermal identifier in the thermal table stored in the thermal database 308. The thermal identifier in the thermal table may be associated with a critical temperature condition, a target temperature condition, a standby temperature condition, and/or any other temperature condition that would be apparent to one of skill in the art in possession of the present disclosure. The thermal control engine 304 may compare the temperature data received from the temperature sensor 208 with the target temperature condition associated with that temperature sensor 208 and/or heat generating component 204 in order to determine whether that target temperature condition is satisfied. For example, when determining whether the target temperature condition is satisfied, the thermal control engine 304 may determine whether the temperature data indicates that the heat generating component 204 is operating at a temperature that is at or above a target temperature. If the target temperature condition of the heat generating component under test is not satisfied, the method 400 returns to block 404 where the thermal test continues to be performed on the thermal testing system 200 at block 404 as discussed above.

If the target temperature condition of the first heat generating component that is undergoing the thermal test is satisfied, the method 400 proceeds to block 414, where the cooling device(s) in the cooling system are operated based on the first temperature data of the first heat generating component that is being tested, while ignoring second temperature data of any second heat generating components that are not being tested. In an embodiment, at block 414, the thermal controller 212 may operate at least one cooling device of the cooling system 214 at a level that is based on the temperature data that is received from the temperature sensor 208 and that is indicative of the temperature of the heat generating component 204 undergoing the thermal test. The thermal controller 212 may operate the at least one cooling device of the cooling system 214 based on the temperature data received from the temperature sensor 208, while ignoring the temperature data received by the temperature sensor 210 associated with the heat generating component 206 that is not undergoing the thermal test but that is otherwise may be experiencing an actual temperature that would otherwise cause the thermal controller 212 to operate the cooling system 214 (i.e., if the thermal test was not being performed.) Ignoring temperature data for the heat generating component 206 by the thermal controller 212 may include discarding and/or otherwise not taking under consideration the temperature data received by the temperature sensor 210, temporarily powering off the temperature sensor 210, masking at least the target temperature conditions for the heat generating component 206, and/or otherwise preventing the temperature data from the temperature sensor 210 from effecting the control the cooling system 214. However, one of skill in the art in possession of the present disclosure will recognize that other methods of ignoring temperature data will fall within the scope of the present disclosure as well.

Thus, when testing target temperature conditions during the thermal test, the thermal controller 212 operates the cooling system 214 when the heat generating component 204 that is being tested satisfies its target temperature condition. However, even if the temperature data received from the heat generating component 206 that is not being tested would otherwise satisfy the target temperature condition of that heat generating component 206 (i.e., when the thermal test is not being performed), the thermal controller 212 does not operate the cooling system 214 as it would when operating according to a standard mode of operation.

Furthermore, when the thermal controller 212 operates the cooling system 214, the thermal control engine 304 of the thermal controller 212/300 may control at least one cooling device of the cooling system 214. For example, the thermal controller 212 may control a first cooling device of the cooling system 214 that is positioned in the chassis 202 order to provide direct cooling to the heat generating component 204, and a second cooling device of the cooling system 214 that is positioned in the chassis 202 in order to provide direct cooling to the heat generating component 206. The thermal controller 212 may then adjust, in response to the temperature data associated with the heat generating component 204 that is undergoing the thermal test and that has had its target temperature condition satisfied, the level of operation of the first cooling device before adjusting the level of operation of the second cooling device. For example, if the target temperature condition is satisfied based on temperature data received from the temperature sensor 208, the thermal control engine 304 may operate a fan that is positioned adjacent the heat generating component 204 while not operating an fan that is positioned adjacent the heat generating component 206. In other examples, the fan adjacent to the heat generating component 204 may include one or more levels of operations such that each level of operation provides a different cooling effect (e.g., a first level may operate the fan at a first speed while a second level may operate the fan at a second speed that is faster than the first speed), and the thermal controller 212 may cause that fan to operate at different levels to attempt to reduce the temperature of the heat generating component 204 below its target temperature condition.

In an embodiment, the device (e.g., the thermal testing system 200, the thermal controller 212, the heat generating components 204 and/or 206, and/or other user device coupled to the thermal testing system 200) that is performing the thermal test on the thermal testing system 200 may gather data from the thermal testing system 200. For example, log files that include data such as a time stamp and temperature for each sensor of the heat generating component being tested may be generated by the thermal controller 212 and collected by an external user device. The external user device and/or the administrator may analyze that data to determine, in conjunction with an algorithm provided by the thermal control engine 304, whether the target temperature condition of the heat generating component 204 that is undergoing the thermal test satisfies a cooling requirement of the heat generating component 204 and/or the thermal testing system 200 that provides proper cooling (as reported by the temperature sensors during the thermal test.) For example, if the thermal controller 212 operates the cooling system 214 at a particular level when the target temperature condition is satisfied, and then the thermal test continues such that both the heat generating components 204 operate to cause a critical temperature condition to ultimately occur, the thermal test may indicate to the administrator a need to decrease the target temperature condition for the heat generating component 204 being tested. In another example, if the thermal controller 212 operates the cooling system 214 at a particular level when the target temperature condition is satisfied, and then the thermal test continues such that both the heat generating components 204 and 206 operate to generate temperature data that indicates that the temperature has fallen below a standby temperature condition or a minimum temperature condition, then the thermal test may indicate to the administrator a need to increase the target temperature condition for the heat generating component being tested.

Referring to the example thermal testing system 500 of FIG. 5 with respect to blocks 412 and 414 of method 400, the thermal controller 510 may determine whether the target temperature condition associated with the switch 512 that is undergoing the thermal test has been satisfied based on the temperature data received from the temperature sensor 550 of the switch 512. If the target temperature condition associated with the switch 512 has not been satisfied, the thermal test may continue such that the network traffic generator 528 continues to generate network data traffic on cables 532-542, and the switch 514, the servers 516-518, and/or the storage system 520 continue to operate (in addition to the switch 512.) During the thermal testing, the thermal controller 510 may receive temperature data from the temperature sensors 552-560, but if the temperature data from any of those temperature sensors 552-560 that are associated with the switch 514, the servers 516-518, and the storage system 520 that are not undergoing the thermal test satisfies a respective target temperature condition, then the thermal controller 510 will continue to operate the thermal test without operating any of the cooling devices 522-526 based on those target temperature conditions (i.e., as the thermal controller 510 would do if the thermal testing system 500 where not testing a target temperature of the switch 512.) Thus, the thermal controller 510 ignores the temperature data from temperature sensors 552-560 of the switch 514, the servers 516-518, and the storage system 520 for their target temperature conditions when the target temperature condition associated with the switch 512 is being tested.

Therefore, if the temperature data received by the thermal controller 510 from the temperature sensor 550 of the switch 512 satisfies the target temperature condition associated with that switch 512, then the thermal controller 510 may operate one or more of the cooling devices 522-524 according to its thermal control algorithm and based on the target temperature condition for the switch 512 being satisfied. In one example, the thermal controller 510 may operate all of the cooling devices 522-526 of the cooling system when the target temperature condition for the switch 512 is satisfied. In another example, the thermal control algorithm may indicate that the cooling device 522 is designated to cool the switches 512-514 when a target temperature condition is satisfied for those switches 512-514, and when the target temperature condition of the switch 512 is satisfied, then the thermal controller 510 may operate cooling device 522 at a particular level to cool the switch 512. In another example, the cooling device 522 may be operating at a first level (e.g., a first fan speed) prior to the thermal controller 510 determining that the target temperature condition for the switch 512 has been satisfied, and then operated at a second level (e.g., a second fan speed that is greater than the first fan speed) subsequent to determining that the target temperature condition for the switch 512 has been satisfied.

In an embodiment, the thermal test device 505 performing the thermal test on the thermal testing system 500 may receive thermal test data from the thermal testing system 500 after the thermal controller 510 has activated the at least one cooling device 522-526 in response to the target temperature condition of the switch 512 being satisfied. The thermal test device 505 and/or an administrator may then determine whether the target temperature condition satisfies a cooling requirement of the switch 512 based on the thermal test data. If the cooling requirement of the switch 512 is satisfied when the cooling device 522 operates as a result of the target temperature condition being satisfied, then the thermal test device 505 and/or the administrator may determine the target temperature condition for the switch 512 and end the thermal test on the thermal testing system 500. If the cooling requirement of the switch 512 is not satisfied when the cooling device 522 operates as a result of the target temperature condition being satisfied, then the target temperature condition at the thermal controller 510 may be adjusted to provide an adjusted target temperature condition for the switch 512, and the thermal test may be performed again on the thermal testing system 500 until a target temperature condition is determined that provides proper cooling for the switch 512.

Thus, systems and methods have been described that provide a thermal testing system that, during a thermal test of a heat generating component, operates a cooling system based on temperature data received from a temperature sensor associated with the heat generating component that is undergoing the thermal test, while ignoring temperature data associated with heat generating components that are operating during the thermal test but are not being tested. As such, when testing a target temperature condition of a heat generating component in a system, the thermal test may simulate a customer's actual use of a system that includes other heat generating components operating to produce heat while the heat generating component undergoing the thermal test is operating as well. The systems and methods prevent the heat generating components that are not being tested from driving the cooling system before the temperature of the heat generating component that is undergoing the thermal test has satisfied its target temperature, thus providing for the more accurate determination of target temperature conditions for heat producing components being thermally tested.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A thermal testing system, comprising:
   a chassis;
   a first heat generating component that is housed in the chassis, wherein the first heat generating component includes a first temperature sensor;
   at least one second heat generating component that is housed in the chassis, wherein each at least one second heat generating component includes a respective second temperature sensor;
   at least one cooling device that is housed in the chassis; and
   a thermal controller that is coupled to the first temperature sensor, the at least one respective second temperature sensor, and the at least one cooling device, wherein the thermal controller is configured to:
   receive, from the first temperature sensor during a thermal test for the first heat generating component, first temperature data that is indicative of heat generated in response to operation of the first heat generating component, wherein the first heat generating component and the at least one second heat generating component operate as part of the thermal test;
   receive, from each second temperature sensor during the thermal test, second temperature data that is indicative of heat generated in response to the operation of the at least one second heat generating component;
   operate the at least one cooling device at a first level based on the first temperature data while ignoring the second temperature data that is configured to cause operation of the at least one cooling device when the second temperature data satisfies a target temperature condition associated with the second temperature sensor, wherein the ignoring the secondary temperature data prevents the second temperature data from being used to operate the at least one cooling device during the thermal test of the first heat generating component; and
   operate the at least one cooling device at a second level based on the second temperature data when the second temperature data satisfies a critical temperature condition associated with the second temperature sensor.

2. The thermal testing system of claim 1, wherein the thermal controller is configured to:
   determine that the first temperature data satisfies a target temperature condition for the first heat generating component and, in response, operate the at least one cooling device at the first level based on the first temperature data while ignoring the second temperature data to prevent the second temperature data from being used to operate the at least one cooling device during the thermal test of the first heat generating component when the second temperature data satisfies the target temperature condition associated with the second temperature sensor.

3. The thermal testing system of claim 2, wherein the thermal controller is configured to:
   determine that operation of the at least one cooling device at the first level does not satisfy a cooling requirement of the first heat generating component and, in response, adjust the target temperature condition to provide an adjusted target temperature condition for the first heat generating component.

4. The thermal testing system of claim 2, wherein the thermal controller is configured to:
   determine that the second temperature data has not reached the critical temperature condition for each of the at least one second heat generating component and, in response, operate the at least one cooling device at the first level based on the first temperature data while ignoring the second temperature data to prevent the second temperature data from being used to operate the at least one cooling device during the thermal test of the first heat generating component.

5. The thermal testing system of claim 1, further comprising:
   a network traffic generator that is coupled to at least one of the first heat generating component and the second heat generating component via a first network cable, wherein the first network cable is configured to:
   generate, during the thermal test, first network cable thermal energy when first network traffic is provided to the at least one of the first heat generating component and the at least one second heat generating component via the first network cable, and wherein the first network cable thermal energy contributes to the first temperature data captured by the first temperature sensor.

6. The thermal testing system of claim 5, further comprising:
   a second network cable coupling the second heat generating component and the first heat generating component, wherein the second network cable is configured to generate second network cable thermal energy when second network traffic is provided through the second network cable, and wherein the second network cable thermal energy contributes to the first temperature data captured by the first temperature sensor.

7. The thermal testing system of claim 1, wherein the at least one cooling device includes a first cooling device and a second cooling device, wherein the first cooling device is positioned within the chassis to provide direct cooling to the first heat generating component and the second cooling device is positioned within the chassis to provide direct cooling to the at least one second heat generating component, and wherein the thermal controller is configured to:
adjust, in response to determining the first temperature data satisfies a target temperature condition of the first temperature sensor, the operation of the first cooling device before adjusting the operation of the second cooling device.

8. An Information Handling System (IHS) comprising:
a communication subsystem;
a processing system that is coupled to the communication subsystem; and
a memory system that is coupled to the processing system and that includes instruction that, when executed by the processing system, cause the processing system to provide a thermal control engine that is configured to:
receive, via the communication subsystem from a first temperature sensor during a thermal test for a first heat generating component, first temperature data that is indicative of heat generated in response to operation of a first heat generating component, wherein the first heat generating component and at least one second heat generating component operate as part of a thermal test;
receive, via the communication subsystem from at least one second temperature sensor during the thermal test, second temperature data that is indicative of heat generated in response to the operation of the at least one second heat generating component;
operate at least one cooling device at a first level based on the first temperature data while ignoring the second temperature data that is configured to cause operation of the at least one cooling device when the second temperature data satisfies a target temperature condition associated with the second temperature sensor, wherein the ignoring the second temperature data prevents the second temperature data from being used to operate the at least one cooling device during the thermal test of the first heat generating component; and
operate the at least one cooling device at a second level based on the second temperature data when the second temperature data satisfies a critical temperature condition associated with the second temperature sensor.

9. The IHS of claim 8, wherein the thermal control engine is configured to:
determine that the first temperature data satisfies a target temperature condition for the first heat generating component and, in response, operate the at least one cooling device at the first level based on the first temperature data while ignoring the second temperature data to prevent the second temperature data from being used to operate the at least one cooling device during the thermal test of the first heat generating component when the second temperature data satisfies the target temperature condition associated with the second temperature sensor.

10. The IHS of claim 9, wherein the thermal control engine is configured to:
determine that operation of the at least one cooling device at the first level does not satisfy a cooling requirement of the first heat generating component and, in response, adjust the target temperature condition to provide an adjusted target temperature condition for the first heat generating component.

11. The IHS of claim 9, wherein the thermal control engine is configured to:
determine that the second temperature data has not reached the critical temperature condition for each of the at least one second heat generating component and, in response, operate the at least one cooling device at the first level based on the first temperature data while ignoring the second temperature data to prevent the second temperature data from being used to operate the at least one cooling device during the thermal test for the first heat generating component.

12. The IHS of claim 8, wherein a network traffic generator is coupled to at least one of the first heat generating component and the at least one second heat generating component via a first network cable,
wherein the first network cable is configured to generate, during the thermal test, first network cable thermal energy when first network traffic is provided to the at least one of the first heat generating component and the at least one second heat generating component via the first network cable, and
wherein the first network cable thermal energy contributes to the first temperature data captured by the first temperature sensor.

13. The IHS of claim 12, wherein a second network cable is coupled to the at least one second heat generating component and the first heat generating component,
wherein the second network cable is configured to generate second network cable thermal energy when second network traffic is provided through the second network cable, and
wherein the second network cable thermal energy contributes to the first temperature data captured by the first temperature sensor.

14. The IHS of claim 8, wherein the at least one cooling device includes a first cooling device and a second cooling device,
wherein the first cooling device is positioned to provide direct cooling to the first heat generating component and the second cooling device is positioned to provide direct cooling to the at least one second heat generating component, and
wherein the thermal control engine is configured to:
adjust, in response to determining the first temperature data satisfies a target temperature condition of the first temperature sensor, the operation of the first cooling device before adjusting the operation of the second cooling device.

15. A method of thermal testing, comprising:
receiving, by a thermal controller, first temperature data generated by a first temperature sensor during a thermal test for a first heat generating component that is indicative of heat generated in response to operation of the first heat generating component, wherein the first heat generating component and at least one second heat generating component operate as part of the thermal test;
receiving, by the thermal controller, second temperature data generated by at least one second temperature sensor during the thermal test that is indicative of heat generated in response to the operation of the at least one second heat generating component;

operating, by the thermal controller, at least one cooling device at a first level based on the first temperature data while ignoring the second temperature data that is configured to cause operation of the at least one cooling device when the second temperature data satisfies a target temperature condition associated with the second temperature sensor, wherein the ignoring the second temperature data prevents the second temperature data from being used to operate the at least one cooling device during the thermal test for the first heat generating component; and operating, by the thermal contoller, the at least one cooling device at a second level based on the second temperature data when the second temperature data satisfies a critical temperature condition associated with the second temperature sensor.

16. The method of claim 15, further comprising:
determining, by the thermal controller, that the first temperature data satisfies a target temperature condition for the first heat generating component and, in response, operate the at least one cooling device at the first level based on the first temperature data while ignoring the second temperature data to prevent the second temperature data from being used to operate the at least one cooling device during the thermal test for the first heat generating component when the second temperature data satisfies the target temperature condition associated with the second temperature sensor.

17. The method of claim 16, further comprising:
determining, by the thermal controller, that operation of the at least one cooling device at the first level does not satisfy a cooling requirement of the first heat generating component and, in response, adjusting the target temperature condition to provide an adjusted target temperature condition for the first heat generating component.

18. The method of claim 16, further comprising:
determining, by the thermal controller, that the second temperature data has not reached the critical temperature condition for each of the at least one second heat generating component and, in response, operate the at least one cooling device at the first level based on the first temperature data while ignoring the second temperature data to prevent the second temperature data from being used to operate the at least one cooling device during the thermal test for the first heat generating component.

19. The method of claim 15, wherein a network traffic generator is coupled to at least one of the first heat generating component and the at least one second heat generating component via a first network cable,
wherein the first network cable is configured to generate, during the thermal test, first network cable thermal energy when first network traffic is provided to the at least one of the first heat generating component and the at least one second heat generating component via the first network cable, and
wherein the first network cable thermal energy contributes to the first temperature data captured by the first temperature sensor.

20. The method of claim 19, wherein a second network cable is coupled to the at least one second heat generating component and the first heat generating component,
wherein the second network cable is configured to generate second network cable thermal energy when second network traffic is provided through the second network cable, and
wherein the second network cable thermal energy contributes to the first temperature data captured by the first temperature sensor.

* * * * *